(12) United States Patent
Freeman et al.

(10) Patent No.: US 6,531,720 B2
(45) Date of Patent: Mar. 11, 2003

(54) DUAL SIDEWALL SPACER FOR A SELF-ALIGNED EXTRINSIC BASE IN SIGE HETEROJUNCTION BIPOLAR TRANSISTORS

(75) Inventors: Gregory G. Freeman, Hopewell Junction, NY (US); David R. Greenberg, White Plains, NY (US); Shwu-Jen Jeng, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/838,417

(22) Filed: Apr. 19, 2001

(65) Prior Publication Data

US 2002/0153535 A1 Oct. 24, 2002

(51) Int. Cl.[7] ................................................ H01L 29/76
(52) U.S. Cl. ....................................... 257/197; 257/198
(58) Field of Search .................................. 257/197, 198

(56) References Cited

U.S. PATENT DOCUMENTS

| | | |
|---|---|---|
| 4,499,657 A | 2/1985 | Ooga et al. |
| 5,060,031 A | 10/1991 | Abrokwah et al. |
| 5,117,271 A * | 5/1992 | Comfort et al. |
| 5,436,180 A | 7/1995 | de Fresart et al. |
| 5,583,059 A | 12/1996 | Burghartz |
| 5,620,907 A | 4/1997 | Jalali-Farahani et al. |
| 5,633,179 A | 5/1997 | Kamins et al. |
| 5,656,514 A | 8/1997 | Ahlgren et al. |
| 5,656,515 A * | 8/1997 | Chandrasekhar et al. |
| 5,668,022 A | 9/1997 | Cho et al. |
| 5,834,800 A | 11/1998 | Jalali-Farahani et al. |
| 5,952,701 A | 9/1999 | Buluccea et al. |
| 6,037,616 A * | 3/2000 | Amamiya et al. |
| 6,049,098 A * | 4/2000 | Sato |

* cited by examiner

Primary Examiner—Stephen D. Meier
(74) Attorney, Agent, or Firm—Whitham, Curtis & Christofferson, P.C.

(57) ABSTRACT

A method for forming a heterojunction bipolar transistor includes forming two sets of spacers on the sides of an emitter pedestal. After the first set of spacers is formed, first extrinsic base regions are implanted on either side of an intrinsic base. The second set of spacers is formed on the first set of spacers. Second extrinsic base regions are then implanted on respective sides of the intrinsic base. By using two sets of spacers, the first and second extrinsic base regions have different widths. This advantageously brings the combined extrinsic base structure closer to the emitter of the transistor but not closer to the collector. As a result, the base parasitic resistance is reduced along with collector-to-extrinsic base parasitic capacitance. The performance of the transistor is further enhanced as a result of the extrinsic base regions being self-aligned to the emitter and collector.

3 Claims, 5 Drawing Sheets

DUAL SIDEWALL SPACER FOR A SELF-ALIGNED EXTRINSIC BASE IN SIGE HETEROJUNCTION BIPOLAR TRANSISTORS

BACKGROUND OF THE INVENTION

1. Field of the Invention

This invention generally relates to the fabrication of semiconductor electronic integrated circuits, and more particularly to a method for making a self-aligned heterojunction bipolar transistor (HBT).

2. Description of the Related Art

The bipolar transistor is a basic element in integrated circuits because of its high-speed switching capability and current carrying capacity. One type of bipolar transistor, known as a heterojunction bipolar transistor (HBT), offers advantages over conventional junction bipolar transistors by providing a bandgap difference between base and emitter regions. In an NPN transistor, this bandgap difference restricts hole flow from base to emitter which, in turn, improves emitter-injection efficiency and current gain. The improved emitter-injection efficiency allows for the use of low resistivity base regions and high resistivity emitter regions. This creates fast devices without compromising other device parameters. As a result, HBTs realize high current gain while simultaneously having a low base resistivity and low emitter base junction capacitance.

Attempts have been made to improve the performance of SiGe HBT transistors. One method uses low-temperature, high-quality homo or heterojunction epitaxial techniques to achieve emitter-base-collector profile optimization. Other methods scale the base width and emitter-base-collector doping profiles of the transistor. While these methods have achieved modest gains in transistor performance, all of them have proven ineffective for reducing parasitic resistances and capacitances such as extrinsic base resistance and collector-base/collector-substrate capacitances.

One conventional approach which attempts to reduce the base-emitter and base-collector junction capacitances and base resistance is disclosed in U.S. Pat. No. 4,499,657. In this patent, a lightly doped silicon layer is epitaxially grown on an oxide film with openings disposed on one main face of a silicon substrate. Single crystal portions are formed in the openings and polycrystalline portions over the oxide. Ion implantation and thermal annealing are then used to convert the polycrystalline portions to opposite conductivity type external base regions and opposite conductivity internal base regions are formed in the single-crystal portions. Finally, arsenic ions are implanted into the internal base to form n-conductivity type emitter regions.

The approach taken in the '657 patent is disadvantageous in a number of respects. First, this method depends on the different rates of dopant diffusion in single-crystal and polycrystalline semiconductor material to form intrinsic and extrinsic base regions. Under these circumstances, it is difficult to control the formation of a thin intrinsic base region in which emitter regions must ultimately be formed. Also, this method produces emitter and base regions which are not self-aligned. This inevitably results in lateral displacement between the emitter and collector, which negatively impacts the performance of the transistor. As a result, this approach is unsuitable for achieving the fine control required when forming an emitter in the intrinsic base region.

U.S. Pat. No. 5,117,271 discloses another conventional method for reducing parasitic resistances and capacitances in an HBT device. In this patent, the extrinsic base region is scaled using spacers formed on the sides of an emitter pedestal. A summary of this method is provided below with reference to FIGS. 8 and 9.

As shown in FIG. 8, the method begins by forming a structure which includes an n$^+$ collector region 1 on top of a sub-collector layer (not shown). In a layer 2 above the collector region, an intrinsic base region 3 of p-type conductivity is formed by depositing an in-situ p-type doped SiGe layer. The intrinsic base region is covered by three layers, namely a silicon dioxide layer 4, a silicon nitride layer 5, and a polysilicon layer 6. An emitter pedestal structure consisting of a nitride layer 7 and an oxide layer 8 are then formed on the polysilicon layer.

In subsequent steps, extrinsic (p$^+$) base regions 9 are formed through ion implantation using boron as the dopant impurity. The extrinsic base regions are scaled and self-aligned using spacers 10 formed on the sides of the emitter pedestal. The emitter pedestal oxide and spacer oxide are then removed. With the pedestal nitride 7 in place, the polysilicon 6 is converted into oxide everywhere except directly underneath the pedestal nitride. Subsequently, the pedestal nitride is removed, and an opening is formed in polysilicon and nitride layers 6 and 5. Before oxide layer 4 is opened, an additional n-type dopant is implanted through this opening to link up with the existing n$^+$ collector region, and this implant is self-aligned to the emitter. After layer 4 is removed, the emitter opening 10 as shown in FIG. 9 is filled with material of n$^+$ conductivity which corresponds to the emitter 11 of the transistor. A silicon nitride 12 cap layer is then formed over the emitter. Subsequently, a thermal drive-in will drive in a thin n$^+$ region which is the single-crystalline emitter region 22.

The conventional method described above is disadvantageous because it cannot optimize transistor performance. It is noted that the thickness of the sidewall spacers sets the distance between the edge of the extrinsic base implants and the edge of the active bipolar device. Consequently, in the structure shown in the '271 patent, if the extrinsic base sidewall is reduced too much, the base resistance underneath the sidewall ($R_{b,sw}$) will experience a reduction, but the collector-to-extrinsic base capacitance ($C_{cb,ext}$) will increase and $f_{max}$ (i.e., the power gain bandwidth product for the device, or the frequency at which the power gain has dropped to a value of 1) will be lowered. This has the following effect.

RF applications generally operate at frequencies up to some fraction of $f_{max}$ (typically ¼–¹⁄₂₀ $f_{max}$), so a higher $f_{max}$ is desirable to allow the device to be useful in higher frequency applications. Higher peak $f_{max}$ at a given current also can be traded off during circuit design for the same $f_{max}$ but at a lower current, allowing for a lower power design. In the structure shown in the '271 patent, if the extrinsic base sidewall is reduced too much, $f_{max}$ will become lowered thereby compromising device performance.

A reduction in the extrinsic base sidewall thickness in the '271 patent also produces a significant drop off in Early Voltage. Early voltage is a measure of the flatness of an $I_c$ to $V_{ce}$ curve. A flatter $I_c$ vs. $V_{ce}$ curve produces a higher Early Voltage, which is more ideal because of the potential for higher maximum voltage gain. On the other hand, a more slopped the $I_c$ vs. $V_{ce}$ curve limits the maximum voltage gain that the device can achieve. By reducing the sidewall in the '271 patent, Early Voltage is reduced in a manner which significantly degrades device performance.

If the extrinsic base sidewall thickness is increased, the extrinsic base will be formed far away from the collector, which will result in a reduction of collector-to-extrinsic base capacitance $C_{cb,ext}$. This, however, will also bring the extrinsic base away from the emitter, which has the undesirable effect of increasing the resistance underneath the sidewall $R_{b,sw}$ and lowering $f_{max}$. It is therefore apparent that a trade-off exists between collector-to-extrinsic base capacitance $C_{cb,ext}$ and the resistance underneath the sidewall $R_{b,sw}$. The scaling approach taken by the '271 patent is limited because only one of $R_{b,sw}$ and $C_{cb,ext}$ can be improved at the expense of the other.

In view of the foregoing considerations, it is apparent that there is a need for an improved method for forming a heterojunction bipolar transistor which employs a scaling approach that reduces both collector-to-extrinsic base capacitance $C_{cb,ext}$ and the resistance underneath the sidewall $R_{b,sw}$, and moreover one which does so while producing self-aligned emitter, collector, and base regions.

SUMMARY OF THE INVENTION

It is one object of the present invention to provide a heterojunction bipolar transistor with reduced collector-to-extrinsic base capacitance $C_{cb,ext}$ and reduced resistance underneath the sidewall $R_{b,sw}$, an objective which conventional HBTs have heretofore been unable to achieve.

It is another object of the present invention to provide a heterojunction bipolar transistor of the aforementioned type which has self-aligned emitter, collector, and base regions, which self-alignment further enhances performance.

It is another object of the present invention to provide a method for making a heterojunction bipolar transistor as described above, which method includes forming sidewall spacers on an emitter pedestal structure in two stages, where part of the extrinsic base is implanted after the first spacer formation stage and the remaining portion of the extrinsic base is implanted after the second spacer formation stage.

These and other objects of the present invention are achieved by providing a method for forming a heterojunction bipolar transistor which includes forming an emitter pedestal above an intrinsic base region, depositing a first set of spacers on sidewalls of the emitter pedestal, implanting first extrinsic base regions on respective sides of the intrinsic base region, forming a second set of spacers on the first set of spacers, respectively, and implanting second extrinsic base regions on respective sides of the intrinsic base region. During the first implanting step, the first extrinsic base regions are self-aligned to the emitter and collector by the first set of spacers, and during the second implanting step the second extrinsic base regions are self-aligned by the second set of spacers.

By using dual spacers, the present invention brings the extrinsic base closer to the emitter of the transistor but not closer to the collector. As a result, the base resistance under the sidewall is substantially reduced without increasing the collector-to-extrinsic base parasitic capacitance. This advantageously reduces or altogether eliminates any modification in $f_{max}$, thereby improving the performance of the transistor of the present invention compared with conventional devices. This performance is further enhanced by self-aligning the emitter, collector, and base regions.

DESCRIPTION OF THE PREFERRED EMBODIMENTS

The present invention is a method for making a heterojunction bipolar transistor HBT with improved performance compared with conventional HBT formation methods. This is achieved by making an extrinsic base which is close to the emitter, thereby reducing base resistance under the sidewall $R_{b,sw}$, but which at the same time is a sufficient distance away from the collector so as to achieve a low collector-to-extrinsic base capacitance $C_{cb,ext}$. Through this structure, parasitic resistances and capacitances are reduced together to achieve improved transistor performance.

Figure 1:
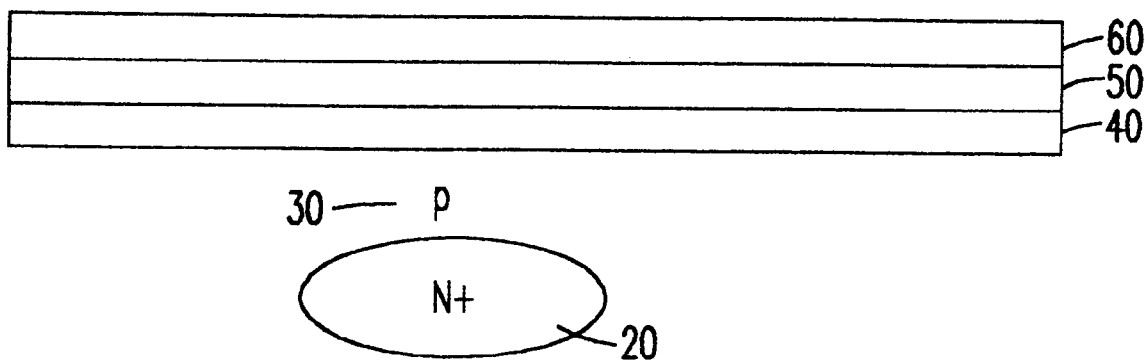
FIG. 1 is a diagram showing the formation of a collector region beneath an intrinsic base region.

Referring to FIG. 1, a preferred embodiment of the method of the present invention begins by forming a structure which includes a heavily doped (n⁺) region 20 which serves as the collector and region 30 made of a p-type conductivity SiGe material grown by low temperature epitaxy (LTE) which serves as an intrinsic base. A number of layers are formed over the base. These layers include an oxide layer 40, a layer 50 of silicon nitride, and a layer 60 of thermally oxidized polysilicon. The structure shown in FIG. 1 may formed in accordance with known techniques including those disclosed in U.S. Pat. No. 5,117,271, the contents of which is hereby incorporated by reference.

Figure 2:
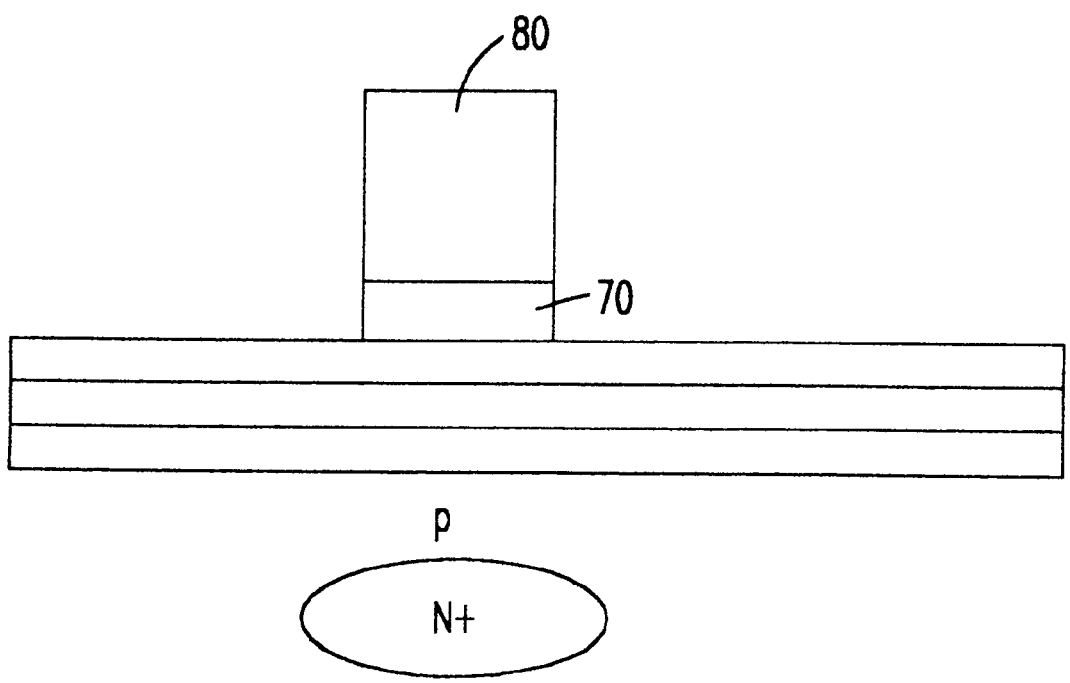
FIG. 2 is a diagram showing the formation of an emitter pedestal above the intrinsic base region.

In a second step of the method, shown in FIG. 2, an emitter pedestal is formed on top of the polysilicon layer. This pedestal includes a nitride layer 70 and an overlying oxide layer 80 made, for example, of tetraethyl orthosilicate (TEOS).

Figure 3:
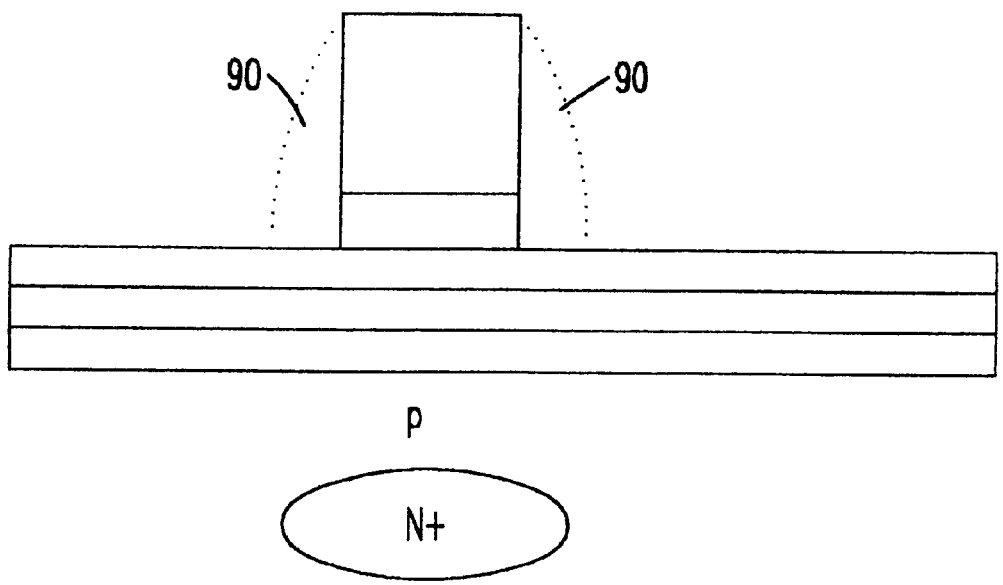
FIG. 3 is a diagram showing a step in a preferred embodiment of the method of the present invention, where a first set of spacers is formed on sidewalls of the emitter pedestal.

In a third step, shown in FIG. 3, a first set of spacers 90 is formed on the sides of the emitter pedestal structure. Preferably, these spacers are formed by conformally depositing a layer of oxide of approximately 0.1–0.2 um over polysilicon layer 60 and pedestal layers 70 and 80, and then removing approximately the same thickness 0.1–0.2 um of the oxide from the polysilicon surface and the surface of the emitter pedestal using reactive ion etching (RIE) or other known techniques. To ensure the oxide is totally removed from the polysilicon surface, after the etch endpoint of polysilicon, a slight over-etch into polysilicon is added. Generally speaking, the thinner the oxide is, the less the over-etch required. This etching results in the formation of sidewalls 90 which have a width in the range of 0.07–0.15 um. This width is selected to ensure that a first portion of an extrinsic base region is sufficiently close to minimize resistance under the sidewall $R_{b,sw}$.

Figure 4:
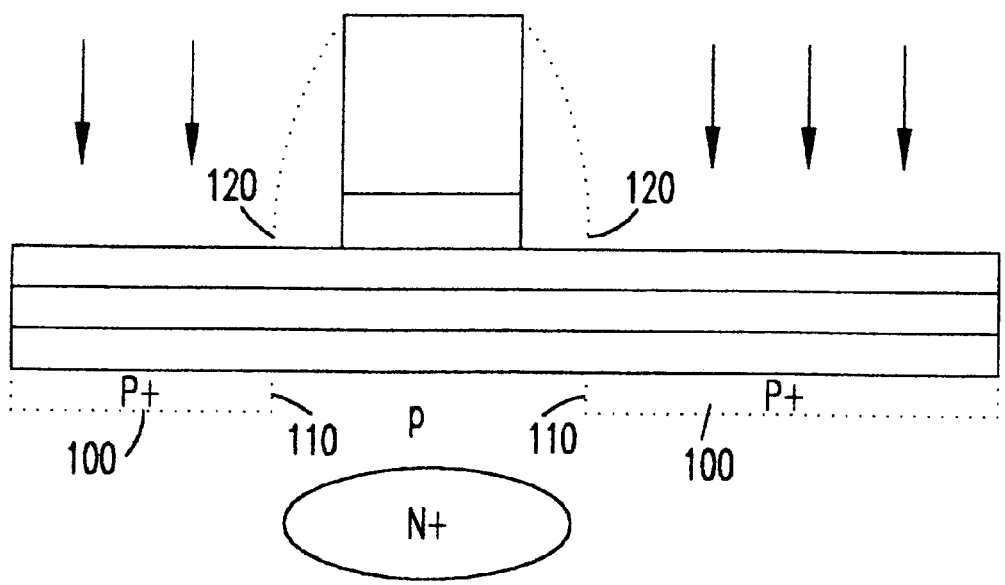
FIG. 4 is a diagram showing another step in the preferred embodiment of the method of the present invention, where first extrinsic base regions are implanted and self-aligned to the emitter location and the collector.

In a fourth step, shown in FIG. 4, the spacers are used to self-align the implantation of extrinsic (p$^+$) base regions 100 under the oxide layer at the desired distance from what will become the emitter of the transistor. This self-alignment is evident from edges 110 of the extrinsic base regions coinciding with the edges 120 of the spacers when viewed along a vertical axis. This results from the spacers blocking ions during implantation, which is illustratively shown by the arrows in the figure. The ion implantation step consists of a shallow boron implant. The ion implantation step produces base regions 100 that are heavily doped with a p-type conductivity dopant such as boron. If desired, regions 100 may be characterized as being doped to a p$^{++}$ concentration.

The implantation step may optionally be preceded by a germanium (Ge) pre-amorphization implant using heavy ions (e.g., Si, Sn Sb, In, Ge) to reduce boron channeling and allow for damage base re-growth after implantation. Ge pre-amorphization is preferable because it will cause the extrinsic base regions to be formed even closer to the emitter compared with conventional single-spacer techniques. This results in further reducing the base resistance ($R_{b,sw}$) of the transistor under the sidewall regions without adversely impacting the collector-to-extrinsic base capacitance ($C_{cb, ext}$). The target implant depth for Ge and B is about 0.02–0.05 um which is the thickness of extrinsic base region 100. The implant energy can be adjusted according to the thickness of the film stack which consists of polysilicon, nitride, and oxide with an implant table.

Figure 5:
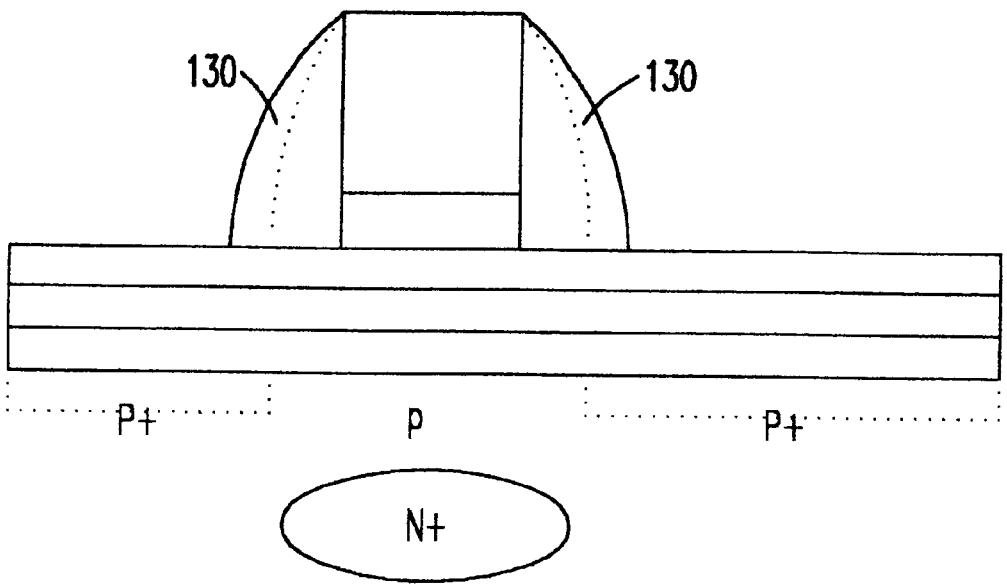
FIG. 5 is a diagram showing another step in the preferred embodiment of the method of the present invention, where a second set of spacers is formed on the first set of spacers.

In a fifth step, shown in FIG. 5, a second set of sidewall spacers 130 is formed on the first set of sidewall spacers. The second spacers may be formed by a deposition and etching technique similar to the first spacer formation step. Preferably, the second set of spacers is made from the same oxide material as the first spacers, however if desired a different material may be used. These spacers are formed by conformally depositing a layer of oxide of approximately 0.05–0.25 um over polysilicon layer 60 and pedestal layers 70 and 80, and then removing approximately same thickness 0.05–0.25 um of the oxide from the polysilicon surface and the surface of the emitter pedestal using reactive ion etching (RIE). To ensure the oxide is totally removed from the polysilicon surface, after the etch endpoint of polysilicon, a slight over-etch into polysilicon is added. The thinner the oxide is, the less the overetch required. This etching results in the formation of sidewalls 130 which have a width in the range of 0.05–0.2 um. The intrinsic base width is approximately of 0.1–0.15 um vertically which is not affected by the extrinsic base placement.

The width of the second spacers is predetermined to control the distance between the second portion of the extrinsic base region and the collector region. This distance is selected to achieve a low collector-to-extrinsic base capacitance $C_{cb, ext}$. Upon completion of this step, the final spacer structure of the present invention has been formed, which corresponds to the combined widths of the first and second spacers. The first spacer width is about 0.07–0.15 um while the second spacer width is about 0.05–0.2 um. The combined spacer is about 0.12–0.35 um.

Figure 6:
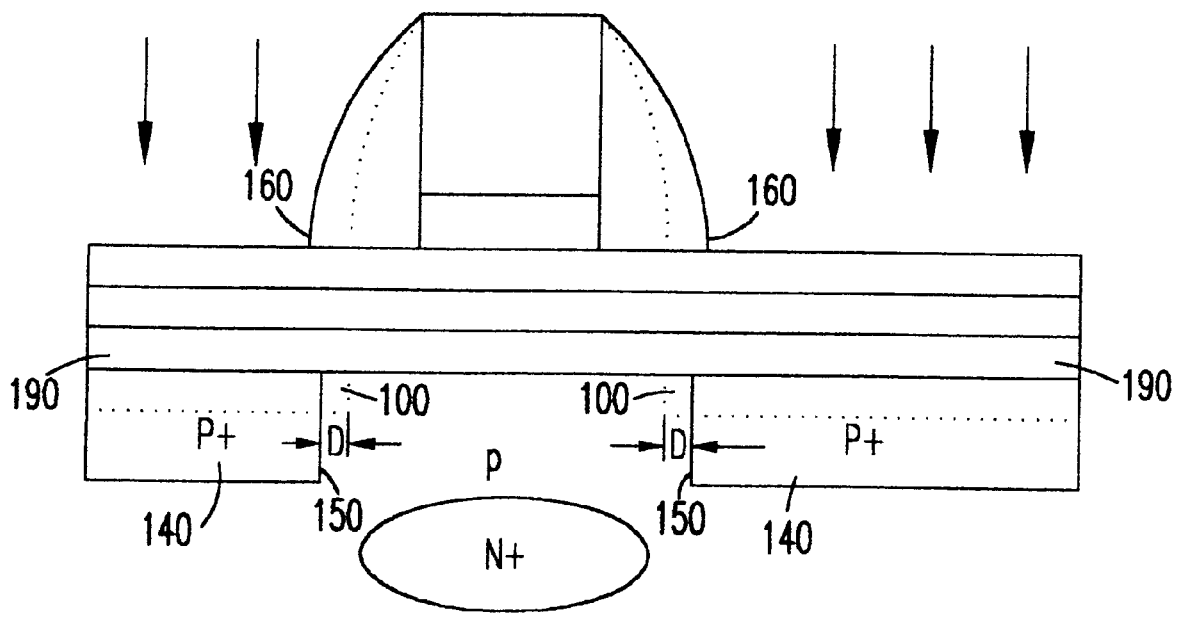
FIG. 6 is a diagram showing another step in the preferred embodiment of the method of the present invention, where second extrinsic base regions are implanted and self-aligned to the emitter location and the collector.

In a sixth step, shown in FIG. 6, the second spacers are used to self-align the implantation of second (p$^+$) portions 140 of the extrinsic base regions under the oxide layer. This self-alignment is evident from edges 150 of the second extrinsic base regions substantially coinciding with the edges 160 of the second spacers when viewed along a vertical axis. During implantation, the second spacers block the dopant atoms, which is illustratively shown by the arrows in the figure. Again, this implant consists of a boron implant at a depth of 0.05 to 0.10 microns with a dose of $1\times10^{15}$ to $1\times10^{16}$. This results in the formation of the second base regions that are heavily doped with a p-type conductivity dopant such as boron. An optional Ge pre-amorphization implant with the same depth 0.05–0.10 um can precede the boron implant.

Through formation of the second spacers, the second base regions are separated from the collector by a greater distance "D" compared with the first extrinsic base regions 100. Here, "D" is the second spacer width which is approximately 0.05–0.2 um. This difference in spacing allows the transistor of the present invention to achieve a low collector-to-extrinsic base capacitance $C_{cb,ext}$ (as a result of base regions being far away from the collector) and at the same time a low base resistance $R_{b,sw}$ under the sidewall regions (as a result of base regions 100 being closely spaced to the emitter). By minimizing both forms of parasitic capacitance and resistance, the transistor of the present invention achieves improved performance compared with conventional devices, which have extrinsic base regions produced from only one set of spacers and therefore, at best, reduce one of the parasitic parameters $R_{b,sw}$ and $C_{cb,ext}$ at the expense of the other.

In performing this second implantation step, the second extrinsic base regions are formed to a depth of 0.05–0.10 um, which may or may not extend as deep as the underlying collector region. The implantation is also controlled so that the second base regions overlap the first base regions (see areas 190), but not completely as shown by distance D.

In subsequent steps of the method, the spacers are removed along with the TEOS oxide layer of the emitter pedestal. This may be performed using, for example, a dip-etch technique which selectively attacks the material from which the spacers are formed (e.g., oxide) but not the nitride layer of the pedestal or the underlying polysilicon layer. In this step, because the polysilicon layer is in its unoxidized state, it acts as an etch-stop.

Figure 7:
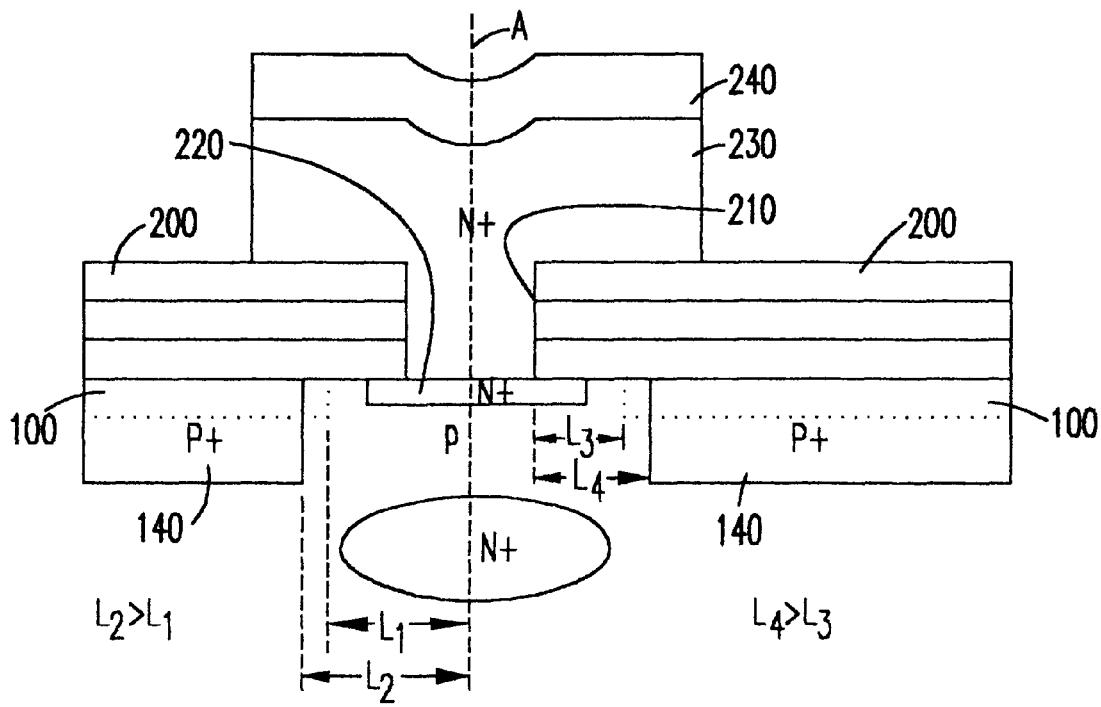
FIG. 7 is a diagram showing the formation of a nitride-capped emitter of the transistor of the present invention.
Figure 8:
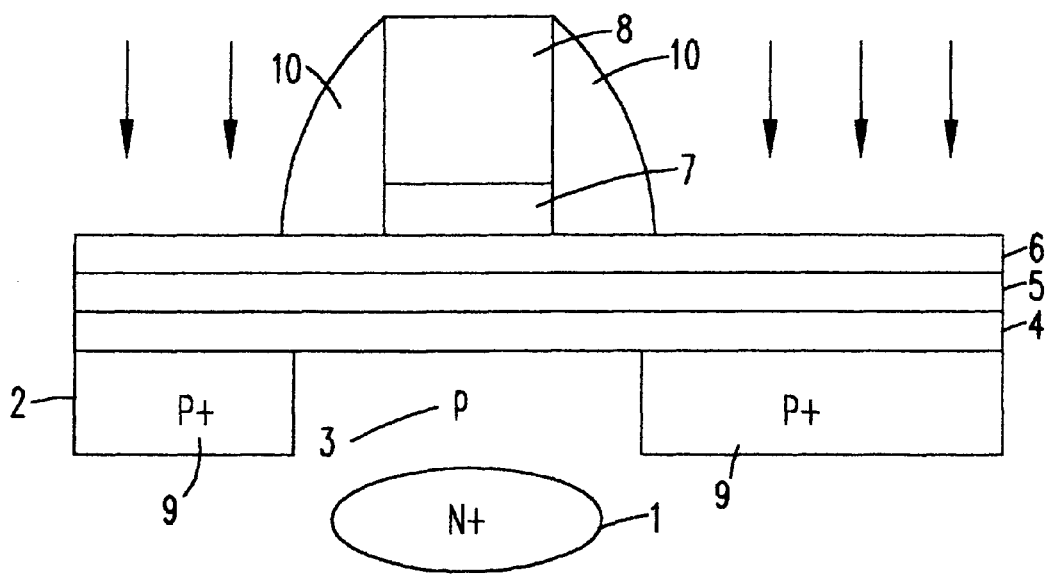
FIGS. 8 and 9 are diagrams showing steps in a conventional method for forming an HBT transistor, where only one set of spacers is used to form the extrinsic base regions of the transistor.
Figure 9:
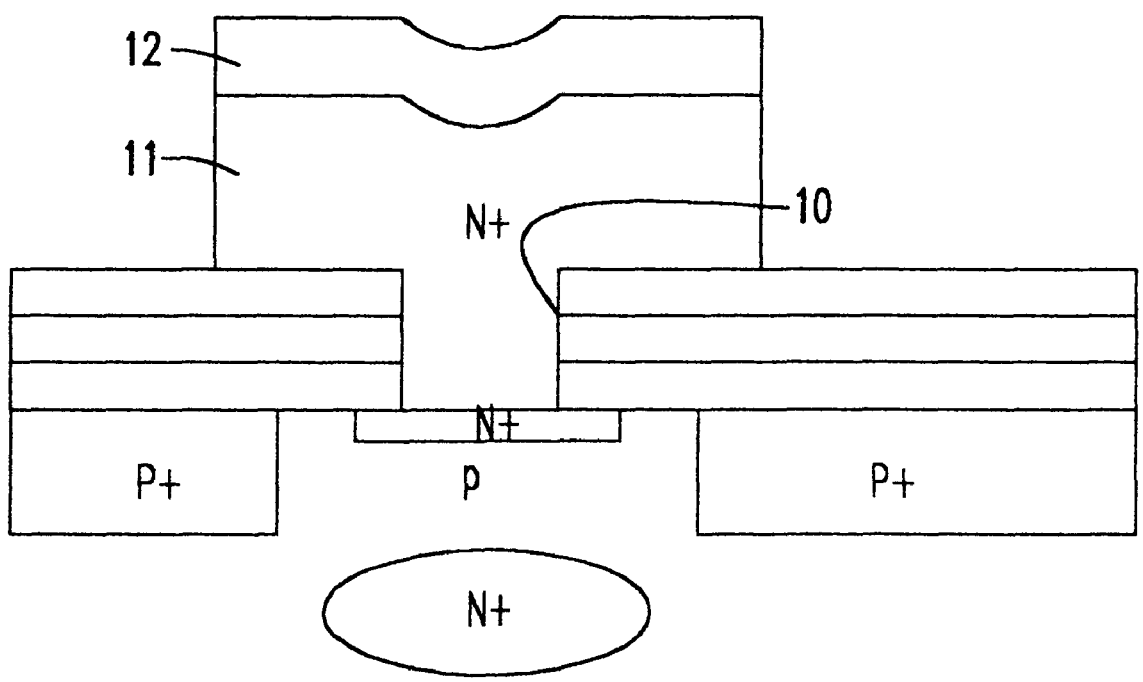

After the spacers have been removed, the polysilicon layer is converted to an oxide using well known thermal oxidation techniques. By thermally oxidizing the polysilicon layer, all of that layer except the portion masked by the pedestal nitride is converted to silicon dioxide regions 200 shown in FIG. 7. In order to provide adequate control of dopant diffusion, oxidation should be performed at as low a temperature as possible. Thus, the nitride layer serves as an oxidation stop and prevents oxidation of polysilicon directly underneath it.

Conversion of the polysilicon layer to an oxide is followed by formation of an opening 210 in the transistor structure at a position above the intrinsic base region. This opening is formed in accordance with steps that include selectively etching the nitride layer 70 and the underlying polysilicon, silicon nitride, and oxide layers 60, 50, and 40. The selective etch may be performed by a hot phosphoric ($H_3PO_4$) acid dip-etch using oxidized regions 200 as masking layers.

Alternatively, the selective etch may involve removing nitride 70 by reactive ion etching using $CF_4/CO_2$ as an etchant. The polysilicon layer may then be removed by dip-etching in KOH or by plasma etching in HBr—$Cl_2$—He—$O_2$, HCl—$O_2$—Ar, in $CF_2$ or $SF_6$ in a well known manner, and the silicon nitride may be removed by reactive ion etching using $CF_4/CO2$ and stop on the underlying oxide. Finally, the oxide layer on surface of the intrinsic base may be removed using a wet etch such as dilute hydrofluoric acid (HF). Before the oxide is removed, an additional n-type dopant is implanted through this opening to link up with the existing $n^+$ collector region, and this implant is self-aligned to the emitter.

Once the surface of the intrinsic base region is exposed, a layer of $n^+$ conductivity type polysilicon is conformally deposited over the surface of the silicon dioxide regions 200 and into the opening including over the surface of the intrinsic base region. The $n^+$ layer is then subjected to a thermal drive-in step which causes n-type dopant to outdiffuse into the p-type conductivity intrinsic base region, thereby forming the $n^+$-type emitter diffusion region 220. These steps are followed by the deposition of $n^+$ material 230 into the opening to form the emitter of the transistor. A nitride cap layer 240 is then formed over the emitter 42 and contact regions are formed.

The method of the present invention produces an HBT transistor with improved performance compared with transistors made by the conventional single-sidewall spacer technique. By using a two-spacer structure as described above, the extrinsic base region is formed from two portions, one close in proximity to the emitter and the other spaced a greater distance from the collector. The spacing difference from the collector is evident from $L_2>L_1$ and the spacing difference from the emitter is evident from $L_4>L_3$ in FIG. 7. Preferably, extrinsic base regions 100 are equally distances from vertical axis A passing through the center of the collector, and the same is true of extrinsic base regions 140. As a result of these spacing differences, the present invention achieves a simultaneous reduction in $R_{b,sw}$ and $C_{cb,ext}$, thereby improving overall performance of the transistor. The self-alignment of the emitter, collector, and base regions serve to further enhance this performance.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A heterojunction bipolar transistor, comprising:
   a collector;
   an emitter;
   an intrinsic base; and
   an extrinsic base having a first extrinsic base regions and a second extrinsic base regions, wherein each of said first extrinsic base regions and said second extrinsic base regions are located on respective sides of said intrinsic base, and wherein said first extrinsic base regions are closer to said emitter than said second extrinsic base regions, wherein said first extrinsic base regions are farther away from said collector than said second extrinsic base regions, wherein said first extrinsic base regions have greater widths than said second extrinsic base regions, and wherein said first and said second extrinsic base regions have respective substantially parallel edges oriented in respective directions substantially normal to their widths, each of said edges of said second extrinsic base regions being separated from said collector by a greater distance than said edges of said first extrinsic base regions.

2. The transistor of claim 1, wherein said emitter, said collector, and said first extrinsic base regions and said second extrinsic base regions are self-aligned.

3. The transistor of claim 1, wherein said first extrinsic base regions include a pre-amorphization implant.

* * * * *